United States Patent
Zhu et al.

(10) Patent No.: US 6,812,176 B1
(45) Date of Patent: Nov. 2, 2004

(54) LOW CONDUCTIVITY AND SINTERING-RESISTANT THERMAL BARRIER COATINGS

(75) Inventors: Dongming Zhu, Westlake, OH (US); Robert A. Miller, Brecksville, OH (US)

(73) Assignees: Ohio Aerospace Institute, Cleveland, OH (US); The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 213 days.

(21) Appl. No.: 09/904,084

(22) Filed: Jul. 12, 2001

Related U.S. Application Data

(60) Provisional application No. 60/263,257, filed on Jan. 22, 2001.

(51) Int. Cl.[7] .............................................. C04B 35/48
(52) U.S. Cl. ...................................... 501/102; 501/103
(58) Field of Search ................................ 501/102, 103; 252/62

(56) References Cited

U.S. PATENT DOCUMENTS

| | | | |
|---|---|---|---|
| 3,634,113 A | * | 1/1972 | Fehrenbacher |
| 3,645,894 A | | 2/1972 | Krystyniak |
| 3,957,500 A | | 5/1976 | Pitts |
| 4,055,705 A | | 10/1977 | Stecura et al. |
| 4,205,051 A | | 5/1980 | Takahashi et al. |
| 4,399,199 A | | 8/1983 | McGill et al. |
| 4,535,033 A | | 8/1985 | Stecura |
| 4,588,655 A | | 5/1986 | Kushner |
| 4,996,117 A | | 2/1991 | Chu et al. |
| 5,238,886 A | | 8/1993 | Luszcz et al. |
| 5,652,044 A | | 7/1997 | Rickerby |
| 5,843,585 A | | 12/1998 | Alperine et al. |
| 5,975,852 A | | 11/1999 | Nagaraj et al. |
| 6,020,075 A | | 2/2000 | Gupta et al. |
| 6,025,078 A | | 2/2000 | Rickerby et al. |
| 6,044,830 A | * | 4/2000 | Jones .......................... 501/103 |
| 6,168,874 B1 | | 1/2001 | Gupta et al. |
| 6,210,812 B1 | | 4/2001 | Hasz et al. |
| 6,440,575 B1 | | 8/2002 | Heimberg et al. |

FOREIGN PATENT DOCUMENTS

| | | |
|---|---|---|
| WO | 94/08069 | 4/1994 |

\* cited by examiner

*Primary Examiner*—Paul Marcantoni
(74) *Attorney, Agent, or Firm*—Pearne & Gordon LLP

(57) ABSTRACT

A thermal barrier coating composition comprising a base oxide, a primary stabilizer oxide, and at least one dopant oxide is disclosed. Preferably, a pair of group A and group B defect cluster-promoting oxides is used in conjunction with the base and primary stabilizer oxides. The new thermal barrier coating is found to have significantly lower thermal conductivity and better sintering resistance. The base oxide is selected from the group consisting of zirconia and hafnia and combinations thereof. The primary stabilizing oxide is selected from the group consisting of yttria, dysprosia, erbia and combinations thereof. The dopant or group A and group B cluster-promoting oxide dopants are selected from the group consisting of rare earth metal oxides, transitional metal oxides, alkaline earth metal oxides and combinations thereof. The dopant or dopants preferably have ionic radii different from those of the primary stabilizer and/or the base oxides.

29 Claims, No Drawings

LOW CONDUCTIVITY AND SINTERING-RESISTANT THERMAL BARRIER COATINGS

CROSS-REFERENCE TO RELATED APPLICATIONS

This application claims the benefit of U.S. Provisional Patent Application Ser. No. 60/263,257 filed Jan. 22, 2001, the contents of which are incorporated herein by reference in their entirety.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract NCC-617 awarded by NASA.

FIELD OF THE INVENTION

The invention relates to a low conductivity thermal barrier coating, in particular to a low conductivity thermal barrier coating containing zirconia and/or hafnia, and a combination of rare earth oxides and/or certain other oxides.

BACKGROUND OF THE INVENTION

If Thermal barrier coatings are thin ceramic layers that are used to insulate air-cooled metallic components from high temperature gases in gas turbine or other heat engines. Such coatings are useful in protecting and extending the service life of metallic components exposed to high temperatures, such as jet engine turbine blades. Thermal barrier coatings composed of yttria-stabilized zirconia are known, wherein the yttria typically makes up seven to nine weight percent (or four to five molar percent) of the total composition. These coatings are typically applied using plasma spraying or physical vapor deposition process in which melted ceramic particles or vaporized ceramic clouds are deposited onto the surface of the component that is to be protected. Thermal barrier coatings are somewhat porous with overall porosities generally in the range of 5 to 20%. This porosity serves to reduce the coating's thermal conductivity below the intrinsic conductivity of the dense ceramic, as well as to improve the coating's strain tolerance. However, the coating conductivity will increase as the porosity decreases in high temperature service due to ceramic sintering.

In a jet engine, higher operating temperatures lead to greater efficiency. However, higher temperatures also cause more problems such as higher stresses, increased materials phase instability and thermal oxidation, leading to premature failure of the component. A ceramic coating with lower thermal conductivity and improved high temperature stability would allow higher operating temperatures while preserving operating life of the coated component. Accordingly there is a need for thermal barrier coatings with a lower conductivity and better sintering resistance than prior art coatings. Such a coating ideally would retain low conductivity after many hours of high temperature service. A laser test, recently developed by the current inventors has allowed simultaneous testing of durability, conductivity, and conductivity increase due to sintering under turbine-level high heat flux conditions. Thus the thermal barrier coating advances described in this invention have had the benefit of this new test approach.

SUMMARY OF THE INVENTION

A thermal barrier coating composition is provided. The composition is about 46–97 molar percent base oxide, about 2–25 molar percent primary stabilizer, about 0.5–12.5 molar percent group A dopant, and about 0.5–12.5 molar percent group B dopant. The base oxide is selected from the group consisting of $ZrO_2$, $HfO_2$, and combinations thereof. The primary stabilizer dopant is selected from the group consisting of $Y_2O_3$, $Dy_2O_3$, and $Er_2O_3$ and combinations thereof. The group A dopant is selected from the group consisting of alkaline earth oxides, transition metal oxides, rare earth oxides and combinations thereof. The group B dopant is selected from the group consisting of $Nd_2O_3$, $Sm_2O_3$, $Gd_2O_3$, $Eu_2O_3$ and combinations thereof.

DETAILED DESCRIPTION OF THE PREFERRED EMBODIMENTS OF THE INVENTION

As used herein and in the claims, all percentages are given as molar percent unless otherwise indicated. As used herein, when a preferred range such as 5–25 is given, this means preferably at least 5 and, separately and independently, preferably not more than 25.

The thermal barrier coating of the present invention has the following preferred formulation or table of components. In this formulation or table of components, any preferred or less preferred molar percent or molar percent range of any component can be combined with any preferred or less preferred molar percent or molar percent range of any of the other components; it is not required or necessary that all or any of the molar percents or molar percent ranges come from the same column.

TABLE OF COMPONENTS

| | MOLAR PERCENTS | | |
|---|---|---|---|
| | Less Preferred | Less Preferred | Preferred |
| Base | 60–93 | 82–91 | 86 |
| | 46–97 | 73–92 | 84–89 |
| Primary | 4–17 | 6–12 | 9 |
| Stabilizer | 3–20 | 4–14 | 7–10 |
| | 2–25 | | |
| Group A Dopant | 0.9–8 | 1.75–4.5 | 2.5 |
| | 0.8–9 | 1.5–5 | |
| | 0.7–10 | 1.25–6 | |
| | 0.5–12 | 1–7 | |
| | 0–25 | | |
| Group B Dopant | 0.9–8 | 1.75–4.5 | 2.5 |
| | 0.8–9 | 1.5–5 | |
| | 0.7–10 | 1.25–6 | |
| | 0.5–12 | 1–7 | |
| | 0–25 | | |

The base oxide is preferably zirconium oxide ($ZrO_2$), hafnium oxide ($HfO_2$), or a combination of zirconium oxide and hafnium oxide.

The primary stabilizer is preferably yttrium oxide ($Y_2O_3$), less preferably dysprosium oxide ($Dy_2O_3$), less preferably erbium oxide ($Er_2O_3$) or combinations of any of these.

The group A dopant is preferably scandia oxide ($Sc_2O_3$) or ytterbium oxide ($Yb_2O_3$), less preferably combinations of these, less preferably nickel (II) oxide (NiO), chromium (III) oxide ($Cr_2O_3$), Cobalt (II) oxide CoO, iron (III) oxide ($Fe_2O_3$), magnesium (II) oxide (MgO), less preferably titanium (IV) oxide ($TiO_2$), ruthenium (IV) oxide ($RuO_2$), tantalum oxide ($Ta_2O_5$) or combinations of any of the foregoing, less preferably any other rare earth oxide, including or excluding erbium oxide ($Er_2O_3$), alkaline earth metal oxide, transition metal oxide, or combinations of any of the foregoing.

The radii of cations of the group A dopant oxide preferably are smaller than the radii of the cations of the primary stabilizer and/or the base oxide.

The group B dopant is preferably neodymium oxide ($Nd_2O_3$) or gadolinium oxide ($Gd_2O_3$), less preferably samarium oxide ($Sm_2O_3$), less preferably europium oxide ($Eu_2O_3$), or combinations of any of these.

The radii of cations of the group B dopant oxide preferably are larger than the radii of the cations of the primary stabilizer and/or the base oxide.

The group A and group B dopants are preferably present in substantially equal molar percents in the thermal barrier composition. Less preferably the group A and group B dopants are present in a molar percent ratio between 1.1:1 to 1:1.1, less preferably 1.5:1 to 1:1.5, less preferably 1:2 and 2:1, less preferably 1:4 to 4:1, less preferably 1:8 to 8:1. Less preferably the group A or group B dopant can be omitted entirely.

The molar percent ratio between the primary stabilizer and the total group A and group B dopants is preferably about 2:1 to 5:1, less preferably about 1.5:1 to 6:1, less preferably about 1:1 to 10:1.

Other additives known in the art may also be added in conventional amounts. Because of the difficulty in separating rare earth metals from each other, the listed percentages indicate that the given component (base oxide, primary stabilizer dopant, Group A dopant, Group B dopant) consists essentially of the given metal oxide compound, with allowance for impurities normally tolerated from commercially available sources. The components of the composition are combined as known in the art to form the coating composition.

The invented thermal barrier coating composition is preferably used to coat metal surfaces subject to high temperatures, such as turbine blades in jet engines. The coating may be applied to the substrate in thicknesses and using methods known in the art, principally either plasma spraying or physical vapor deposition.

Without wishing to be bound by any particular theory, it is believed that the invention operates under the following theories.

As discussed above this innovation involves the addition of group A and group B dopant oxides to the zirconia (hafnia)-yttria or other zirconia (hafnia) based systems. The group A and group B dopants are primarily intended to serve three functions:

(1) Creation of thermodynamically stable, highly defective lattice structures with controlled ranges of defect cluster sizes. The intent of these complex structures is to effectively attenuate and scatter lattice phonon waves as well as radiative photon waves at a wide spectrum of frequencies, thus significantly reducing the oxide intrinsic lattice and radiation thermal conductivity;

(2) Production of highly distorted lattice structures with essentially immobile defect clusters and/or nanoscale ordered phases which effectively reduce the mobile defect concentration and suppress the atomic mobility and mass transport, thus significantly improving the oxide sintering-creep resistance;

(3) Improvements in mechanical properties such as fracture toughness as well as durability from the formation of complex nanoscale defect clusters.

The composition design of the multiple component thermal barrier coating systems is based on following considerations:

(1) Lattice Elastic Strain Energy and Ionic Size Considerations:

One or more pairs of additional dopants are incorporated in the $ZrO_2$ ($HfO_2$)-based alloys. The cation ionic sizes of the group A and group B dopants are preferably smaller and larger, respectively, than that of the primary dopant or the base oxides. This will effectively produce lattice distortion in the ceramic alloy solid solutions and it will facilitate local ionic segregation (defect clustering).

(2) Electroneutrality Considerations

The one or more pairs of additional dopants incorporated in the $ZrO_2$ ($HfO_2$) based oxides preferably have cation valencies that are either less than that of zirconia (e.g., valency +2 or +3) or larger than that of zirconia (i.e., valency greater than +4), and less preferably equal to that of zirconia (i.e., valency +4) but with significantly different ionic radius than zirconia. Therefore, high concentration of highly associated defects will be created and stabilized based on the electroneutrality conditions. Strong dopant-oxygen vacancy and dopant-dopant interactions are expected which will promote the formation of extended, immobile defect clusters.

(3) Oxide Free Energy Formation, Oxide Stability and Polarization Considerations The one or more pairs of additional dopants incorporated in the $ZrO_2$ ($HfO_2$) based oxide systems are preferably selected so as to possess the highest possible (most negative value) free energy of formation of the dopant oxides. High free energy of formation of a dopant oxide represents high stability of the oxide in an oxygen-containing atmosphere, which is greatly desirable.

A high free energy of formation of a dopant oxide may also correlate with high polarization of the oxide. The additions of the dopant oxides with mixed polarization and ionic sizes may further introduce lattice defect and distortion for reduced thermal conductivity and improved sintering-creep resistance.

(4) Atomic Weight and Solubility Considerations

High dopant atomic weight is beneficial for improving lattice scattering. High dopant solubility is beneficial for increasing dopant concentrations and thus defect concentrations. A mixture of high- and low-solubility dopants and of high- and low-atomic weight will promote complex structures and thus improved lattice scattering.

The following Examples further illustrate various aspects of the invention. Examples 1–4 each show the components of a preferred embodiment of the invention, the amounts of the ingredients, and the resulting thermal conductivity observed after 20-hour high temperature testing at about 1316° C. (2400° F.) in steady-state laser conductivity tests. The "Group A Overdopant" shown in Example 4 is an example of combining two different types of group A dopants, in this case resulting in a greater total molar percentage of group A dopant than group B dopant. Example 5 shows the baseline control sample, a standard yttria-stabilized zirconia. Percentages are given in molar percent, abbreviated as "mol %".

| | Example: | | | | |
|---|---|---|---|---|---|
| | 1 | 2 | 3 | 4 | 5 |
| Base Oxide | Zirconia 94 mol % | Zirconia 86.5 mol % | Zirconia 86.5 mol % | Zirconia 71.25 mol % | Zirconia 95.5 mol % |

-continued

|  | Example: | | | | |
|---|---|---|---|---|---|
|  | 1 | 2 | 3 | 4 | 5 |
| Primary Stabilizer | Yttria 3 mol % | Yttria 9 mol % | Yttria 9 mol % | Yttria 14 mol % | Yttria 4.5 mol % |
| Group A dopant | Ytterbia 1.5 mol % | Ytterbia 2.25 mol % | Ytterbia 2.25 mol % | Ytterbia 7 mol % | 0 |
| Group B dopant | Samaria 1.5 mol % | Neodymia 2.25 mol % | Gadolinia 2.25 mol % | Neodymia 7 mol % | 0 |
| Group A Overdopant | 0 | 0 | 0 | Scandia 0.75 mol % | 0 |
| Thermal Conductivity (W/m-K) | 0.72 | 0.63 | 0.70 | 0.56 | 1.35 |

As these results demonstrate, the addition of dopants according to the present invention reduces the 20-hour thermal conductivity of the coatings. The coating sintering resistance at high temperature is also significantly improved, as suggested by the significantly lowered rates of the conductivity increase. The magnitude of increases in thermal conductivity after 20 hours in coatings according to the present invention were generally approximately 25–50% less than the magnitude of increase observed in similarly applied prior art 4.55 mol % yttria stabilized zirconia coatings. The foregoing results were surprising and unexpected.

Although the preferred embodiments of the invention have been shown and described, it should be understood that various modifications and changes may be resorted to without departing from the scope of the invention as disclosed and claimed herein.

What is claimed is:

1. A thermal barrier coating composition comprising 46–97 molar percent base oxide, 2–25 molar percent primary stabilizer, 0.5–25 molar percent group A dopant, and 0.5–25 molar percent group B dopant, said base oxide being selected from the group consisting of $ZrO_2$, $HfO_2$ and combinations thereof, said primary stabilizer being selected from the group consisting of $Y_2O_3$, $Dy_2O_3$, $Er_2O_3$, and combinations thereof, said group B dopant being selected from the group consisting of $Nd_2O_3$, $Sm_2O_3$, $Gd_2O_3$, $Eu_2O_3$, and combinations thereof, and said group A dopant being selected from the group consisting of rare earth oxides, alkaline earth metal oxides, transition metal oxides and combinations thereof, but excluding those species contained in said base oxide, group B dopant and primary stabilizer groups,
wherein the ratio of the molar percentages of group A dopant to group B dopant in said composition is between about 1:8 and about 8:1.

2. A thermal barrier coating composition according to claim 1, wherein the group A dopant is selected from the group consisting of $Sc_2O_3$, $Yb_2O_3$, MgO, NiO, $Cr_2O_3$, CoO, $Fe_2O_3$, $TiO_2$, $RuO_2$, $Ta_2O_5$, and combinations thereof.

3. A thermal barrier coating composition according to claim 1, wherein the group A dopant and the group B dopant are present in the composition in substantially equal molar percentages.

4. A thermal barrier coating composition according to claim 1, wherein the ratio of the molar percentages of group A dopant to group B dopant is between about 1:4 and about 4:1.

5. A thermal barrier coating composition according to claim 1, wherein the ratio of the molar percentage of the primary stabilizer to the sum of the molar percentages of the group A dopant and the group B dopant is between 1:1 and 10:1.

6. A thermal barrier coating composition according to claim 1, said composition being a ceramic alloy solid solution having a zirconia or hafnia lattice structure or structures, wherein the ionic radius of the group A dopant cation is smaller than the ionic radius of the primary stabilizer cation in said ceramic alloy solid solution.

7. A thermal barrier coating composition comprising 46–97 molar percent base oxide, 2–25 molar percent primary stabilizer, 0.5–12.5 molar percent group A dopant, and 0.5–12.5 molar percent group B dopant, said base oxide being selected from the group consisting of $ZrO_2$, $HfO_2$ and combinations thereof, said primary stabilizer being selected from the group consisting of $Y_2O_3$, $Dy_2O_3$, $Er_2O_3$ and combinations thereof, said group B dopant being selected from the group consisting of $Nd_2O_3$, $Sm_2O_3$, $Gd_2O_3$, $Eu_2O_3$ and combinations thereof, and said group A dopant being selected from the group consisting of rare earth oxides, alkaline earth metal oxides, transition metal oxides and combinations, thereof, but excluding those species contained in said base oxide, group B dopant and primary stabilizer groups,
wherein the ratio of the molar percentages of group A dopant to group B dopant in said composition is between about 1:8 and about 8:1.

8. A thermal barrier coating composition according to claim 7, wherein the group A dopant is selected from the group consisting of $Sc_2O_3$, $Yb_2O_3$, MgO, NiO, $Cr_2O_3$, CoO, $Fe_2O_3$, $TiO_2$, $RuO_2$, $Ta_2O_5$, and combinations thereof.

9. A thermal barrier coating composition according to claim 7, wherein the group A dopant and the group B dopant are present in the composition in substantially equal molar percentages.

10. A thermal barrier coating composition according to claim 7, wherein the ratio of the molar percentages of group A dopant to group B dopant is between about 1:4 and about 4:1.

11. A thermal barrier coating composition according to claim 7, wherein the ratio of the molar percentage of the primary stabilizer to the sum of the molar percentages of the group A dopant and the group B dopant is between 1:1 and 10:1.

12. A thermal barrier coating composition according to claim 7, said composition being a ceramic alloy solid solution having a zirconia or hafnia lattice structure or structures, wherein the ionic radius of the group A dopant cation is smaller than the ionic radius of the primary stabilizer cation in said ceramic alloy solid solution.

13. A thermal barrier coating composition comprising 46–97 molar percent base oxide, 2–25 molar percent primary stabilizer, and 0.5–25 molar percent each of at least two compounds selected from the group consisting of group A dopants and group B dopants, said base oxide being selected from the group consisting of $ZrO_2$, $HfO_2$ and combinations thereof, said primary stabilizer being selected from the group consisting of $Y_2O_3$, $Dy_2O_3$, and combinations thereof, said group B dopant being selected from the group consisting of $Nd_2O_3$, $Sm_2O_3$, $Gd_2O_3$, $Eu_2O_3$ and combinations thereof, and said group A dopant being selected from the group consisting of rare earth oxides other than $Er_2O_3$, alkaline earth metal oxides, transition metal oxides and combinations thereof, but excluding those species contained in said base oxide, around B dopant and primary stabilizer groups.

14. A thermal barrier coating composition according to claim 13, wherein the group A dopant is selected from the group consisting of $Yb_2O_3$, $Sc_2O_3$, MgO, NiO, $Cr_2O_3$, CoO, $Fe_2O_3$, $TiO_2$, and $RuO_2$.

15. A thermal barrier coating composition according to claim 13, said composition being a ceramic alloy solid solution having a zirconia or hafnia lattice structure or structures, wherein the ionic radius of the group A dopant cation is smaller than the ionic radius of the primary stabilizer cation in said ceramic alloy solid solution.

16. A thermal barrier coating composition according to claim 13, wherein the ratio of the molar percentage of the primary stabilizer to the sum of the molar percentages of the group A dopant and the group B dopant is between 1:1 and 10:1.

17. A thermal barrier coating composition according to claim 1, wherein the ratio of the molar percentages of group A dopant to group B dopant is between about 1:2 and about 2:1.

18. A thermal barrier coating composition according to claim 1, wherein the ratio of the molar percentages of group A dopant to group B dopant is between about 1.5:1 and about 1:1.5.

19. A thermal barrier coating composition according to claim 1, wherein the ratio of the molar percentages of group A dopant to group B dopant is between about 1.1:1 and about 1:1.1.

20. A thermal barrier coating composition according to any one of claims 4, 17, 18, or 19, wherein the group A dopant is selected from the group consisting of $Sc_2O_3$, $Yb_2O_3$, MgO, NiO, $Cr_2O_3$, CoO, $Fe_2O_3$, $TiO_2$, $RuO_2$, $Ta_2O_5$, and combinations thereof.

21. A thermal barrier coating composition according to any one of claims 4, 17, 18, or 19, said composition being a ceramic alloy solid solution having a zirconia or hafnia lattice structure or structures, wherein the ionic radius of the group A dopant cation is smaller than the ionic radius of the primary stabilizer cation in said ceramic alloy solid solution.

22. A thermal barrier coating composition according to any one of claims 1, 4, 17, 18, or 19, said group A dopant being $Yb_2O_3$, $Sc_2O_3$, or a mixture thereof.

23. A thermal barrier coating composition according to any one of claims 1, 4, 17, 18, or 19, said group A dopant being $Yb_2O_3$, $TiO_2$, $Ta_2O_5$ or a mixture thereof.

24. A thermal barrier coating composition according to any one of claims 1, 4, 17, 18, or 19, said base oxide being $ZrO_2$, said group A dopant being $Yb_2O_3$, said group B dopant being $Gd_2O_3$, and said primary stabilizer being $Y_2O_3$.

25. A thermal barrier coating composition according to claim 1, comprising 1.5–5 molar percent group A dopant and 1.5–5 molar percent group B dopant.

26. A thermal barrier coating composition according to any one of claims 1, 4, 17, 18, or 19, said group A and group B dopants each being selected to have a high free energy of formation such that each of said group A and group B dopants exhibits high stability in an oxygen-containing atmosphere.

27. A thermal barrier coating composition according to any one of claims 1, 4, 7, 13, 17, 18, or 19, said group A and group B dopants being selected to provide a mixture of dopants effective to promote complex defect structures and improved lattice scattering in said thermal barrier coating composition.

28. A thermal barrier coating composition comprising a ceramic alloy solid solution having a base oxide lattice structure or structures where the base oxide is present in the solid solution in an amount of 46–97 molar percent, the solid solution further comprising 2–25 molar percent primary stabilizer, 0.5–25 molar percent group A dopant, and 0.5–25 molar percent group B dopant, said base oxide being selected from the group consisting of $ZrO_2$, $HfO_2$ and combinations thereof, said primary stabilizer being selected from the group consisting of $Y_2O_3$, $Dy_2O_3$, $Er_2O_3$ and combinations thereof, each of said group A dopant and said group B dopant being selected from the group consisting of rare earth oxides, alkaline earth metal oxides, transition metal oxides and combinations thereof, but excluding those species contained in said base oxide and primary stabilizer groups, wherein said group A dopant is selected such that the ionic radius of the group A dopant cation is smaller than the ionic radius of the primary stabilizer cation in said solid solution, and wherein said group B dopant is selected such that the ionic radius of the group B dopant cation is larger than the ionic radius of the primary stabilizer cation in said solid solution, the ratio of the molar percentages of group A dopant to group B dopant in said solid solution being between about 1:8 and about 8:1.

29. A thermal barrier coating composition according to claim 28, wherein the ratio of the molar percentages of group A dopant to group B dopant in said solid solution is between about 1:4 and about 4:1.

* * * * *

UNITED STATES PATENT AND TRADEMARK OFFICE
CERTIFICATE OF CORRECTION

PATENT NO. : 6,812,176 B1
DATED : April 25, 2005
INVENTOR(S) : Dongming Zhu et al.

It is certified that error appears in the above-identified patent and that said Letters Patent is hereby corrected as shown below:

Column 1,
Line 20, after "NASA." and insert therefore -- This invention was made with Government support under contract NCC3-617 awarded by NASA. The Government has certain rights in this invention. --.

Column 7,
Line 46, before "17", insert -- 7, --.

Signed and Sealed this

Fifth Day of July, 2005

JON W. DUDAS
*Director of the United States Patent and Trademark Office*